(12) United States Patent
Lee

(10) Patent No.: US 7,521,275 B2
(45) Date of Patent: *Apr. 21, 2009

(54) FREE-STANDING ELECTROSTATICALLY-DOPED CARBON NANOTUBE DEVICE AND METHOD FOR MAKING SAME

(75) Inventor: Ji Ung Lee, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 6 days.

This patent is subject to a terminal disclaimer.

(21) Appl. No.: 11/695,982

(22) Filed: Apr. 3, 2007

(65) Prior Publication Data

US 2007/0275487 A1  Nov. 29, 2007

Related U.S. Application Data

(60) Division of application No. 11/060,667, filed on Feb. 18, 2005, now Pat. No. 7,378,715, which is a continuation-in-part of application No. 10/683,895, filed on Oct. 10, 2003, now Pat. No. 6,890,780.

(51) Int. Cl.
*H01L 21/00* (2006.01)
(52) U.S. Cl. .................... 438/48; 438/49; 977/938; 257/E21.25
(58) Field of Classification Search .............. 438/48, 438/49, 689; 977/938; 257/E21.25
See application file for complete search history.

(56) References Cited

U.S. PATENT DOCUMENTS

| 2002/0173083 A1* | 11/2002 | Avouris et al. | 438/129 |
| 2002/0179434 A1* | 12/2002 | Dai et al. | 204/242 |
| 2004/0043527 A1* | 3/2004 | Bradley et al. | 438/48 |

OTHER PUBLICATIONS

Al Javey et al., "High-K-Dielectrics for Advanced Carbon-Nanotube Transistors and Logic Gates," Nature Materials, Nov. 17, 2002.
"Bright-Band Gap Photolminescence from Unprocessed Single-Walled Carbon Nanotubes", Lefebvre, et al., American Physical Society, pp. 217401-217401-4, May 2003.
"Carbon Nanotube P-N Junction Diodes", Lee et al., American Institute of Physics, pp. 145147, Jul. 2004.

* cited by examiner

*Primary Examiner*—Alexander G Ghyka
*Assistant Examiner*—Seahvosh J Nikmanesh
(74) *Attorney, Agent, or Firm*—Paul J. DiConza

(57) ABSTRACT

A method and associated structure for forming a free-standing electrostatically-doped carbon nanotube device is described. The method includes providing a carbon nanotube on a substrate in such a way as to have a free-standing portion. One way of forming a free-standing portion of the carbon nanotube is to remove a portion of the substrate. Another described way of forming a free-standing portion of the carbon nanotube is to dispose a pair of metal electrodes on a first substrate portion, removing portions of the first substrate portion adjacent to the metal electrodes, and conformally disposing a second substrate portion on the first substrate portion to form a trench.

6 Claims, 6 Drawing Sheets

FREE-STANDING ELECTROSTATICALLY-DOPED CARBON NANOTUBE DEVICE AND METHOD FOR MAKING SAME

CROSS-REFERENCE TO RELATED APPLICATIONS

This application is a divisional application of U.S. patent application Ser. No. 11/060,667 filed Feb. 18, 2005 now U.S. Pat. No. 7,378,715, which is itself a continuation-in-part, and claims the benefit, of U.S. patent application Ser. No. 10/683,895, filed Oct. 10, 2003 now U.S. Pat. No. 6,890,780, the entire contents of which is incorporated by reference.

BACKGROUND

The present invention relates generally to the field of nanotechnology. More specifically, the present invention relates to a method and associated structure for forming a free-standing electrostatically-doped carbon nanotube device.

Carbon nanotubes have attracted a great deal of attention in recent years due to their possibilities for use as nanoscale electronic devices, such as diodes, transistors and semiconductor circuits. Structurally, a carbon nanotube resembles a hexagonal lattice of carbon rolled into a cylinder and may belong to one of two varieties, a single-walled variety and a multi-walled variety. Either of these varieties may, in whole or in part, exhibit the behavior of a metal or a semiconductor material, depending upon their chirality (i.e., conformational geometry).

Carbon nanotubes that exhibit the behavior of a semiconductor material are typically doped using various chemical methods. In other words, different chemicals are used to create p-type (hole majority carrier) regions and n-type (electron majority carrier) regions in the carbon nanotube. This results in a P-N junction that, when an appropriate voltage is applied, emits light (in the case of a light-emitting diode ("LED")). The chemical methods for doping a carbon nanotube, however, suffer from the problem that the p-type regions and the n-type regions are typically not well characterized, resulting in nanoscale electronic devices with reduced performance characteristics.

Thus, what is needed are a method and associated structure for forming an electrostatically-doped carbon nanotube device having well characterized p-type regions and n-type regions, allowing for the creation of nanoscale electronic devices, such as, for example, photodiodes, photo detectors, photovoltaic devices, sensors, and power devices with enhanced performance characteristics.

SUMMARY

Embodiments of the invention provide an electrostatically-doped carbon nanotube device that includes a carbon nanotube disposed on a substrate such that at least a portion of the carbon nanotube is free-standing.

Embodiments of the invention provide a photovoltaic device that includes an electrostatically-doped carbon nanotube device.

Embodiments of the invention provide a method for forming a free-standing electrostatically-doped carbon nanotube device. The method includes providing a carbon nanotube on a substrate. The carbon nanotube has a first end, a second end, and a free-standing portion therebetween.

These and other advantages and features will be more readily understood from the following detailed description of preferred embodiments of the invention that is provided in connection with the accompanying drawings.

DETAILED DESCRIPTION OF PREFERRED EMBODIMENTS

Described embodiments of the invention provide a method and associated structure for forming an electrostatically-doped carbon nanotube device having well characterized p-type regions and n-type regions, allowing for the creation of nanoscale electronic devices, such as photovoltaic diodes, power devices, photodiodes, photo detectors, light-emitting diodes ("LEDs"), and the like, with enhanced performance characteristics. One specific form of electrostatically-doped carbon nanotube device is a free-standing electrostatically-doped carbon nanotube device. More specifically, embodiments of the invention provide for the use of a plurality of doping electrodes that are decoupled from a plurality of bias electrodes. Thus, the doping of a carbon nanotube may be finely tuned by varying the bias of each of the plurality of bias electrodes. Advantageously, the described method and associated structure are capable of providing a carbon nanotube having a P-N junction, a P-I-P junction, a P-I-N junction, an N-I-P junction, an N-I-N junction, a P-N-P junction or an N-P-N junction.

Figure 1:
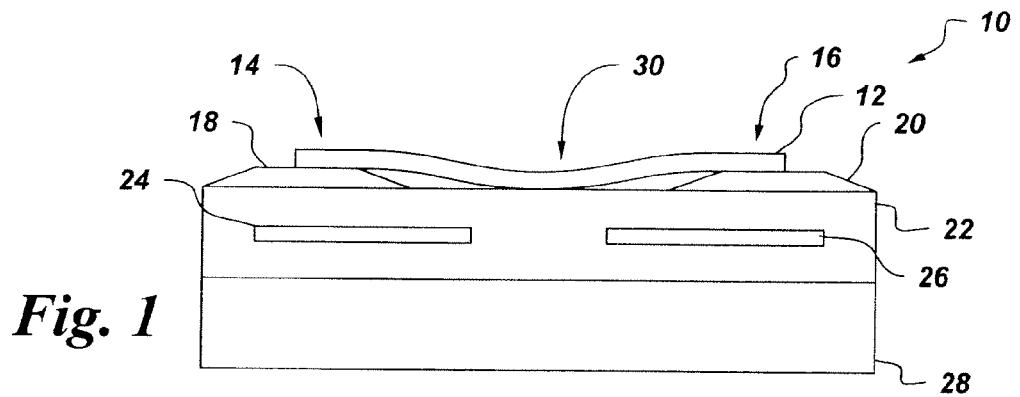
FIG. 1 is a cross-sectional view of an electrostatically-doped carbon nanotube device constructed in accordance with an embodiment of the invention.

Referring to FIG. 1, an electrostatically-doped carbon nanotube device 10 is illustrated including a carbon nanotube 12 having a first end 14 and a second end 16. The carbon nanotube 12 may be either a single-walled carbon nanotube ("SWCNT") or a multi-walled carbon nanotube ("MWCNT"). The carbon nanotube 12 has a length of between about 0.1 microns and about 10 microns and a diameter of between about 0.4 nm and about 20 nm, however other suitable dimensions may be used. In general, a carbon nanotube may act as a metal or a semiconductor material, depending upon its chirality (i.e., conformational geometry). Preferably, the carbon nanotube 12 of the present invention acts as a semiconductor material. The first end 14 of the carbon nanotube 12 is disposed adjacent to and in direct electrical contact with a first metal contact 18. Likewise, the second end 16 of the carbon nanotube 12 is disposed adjacent to and in direct electrical contact with a second metal contact 20. The first metal contact 18 and the second metal contact 20 are each made of Ti, Mo, Au, Cr or the like, and each has an area or size of between about 0.1 microns by about 10 microns and about 1 micron by about 10 microns. In general, any dimensions that provide adequate electrical contact with the first end 14 of the carbon nanotube 12 and the second end 16 of the carbon nanotube 12 may be used. The first metal contact 18 and the second metal contact 20 may be disposed either above or below the first end 14 of the carbon nanotube 12 and the second end 16 of the carbon nanotube 12, respectively.

The first metal contact 18 and the second metal contact 20 are disposed on the surface of a dielectric material 22. The dielectric material 22 includes $SiO_2$, $Si_3N_4$, $Al_2O_3$, $ZrO_2$ or the like. A first metal electrode 24 and a second metal electrode 26 are disposed within the dielectric material 22, adjacent to and at a distance from the first metal contact 18 and the second metal contact 20, respectively. Because of this separation, the first metal electrode 24 is capacitively coupled to the first end 14 of the carbon nanotube 12 and the second metal electrode 26 is capacitively coupled to the second end 16 of the carbon nanotube 12. Preferably, the distance between the first metal electrode 24 and the first end 14 of the carbon nanotube 12 and the second metal electrode 26 and the second end 16 of the carbon nanotube 12 is between about 2 nm and about 100 nm, respectively. The first metal electrode 24 and the second metal electrode 26 are each made of Mo, Ti, Pt, Au, Cr or the like, and each has an area or size of between about 0.1 microns by about 10 microns and about 1 micron by about 10 microns. Advantageously, the area or size of the first metal electrode 24 and the second metal electrode 26 may be selected to achieve a desired spacing between the first metal electrode 24 and the second metal electrode 26. The significance of this spacing is described in detail below. Preferably, the first metal electrode 24 is separated from the second metal electrode by a distance of between about 100 nm and about 1 micron.

The dielectric material 22 is disposed on the surface of a semiconductor material 28, such as Si, SiC or the like. Alternatively, the dielectric material 22 is disposed on the surface of a metal layer 28, such as Al, Cr, Mo, Ti, Pt or the like. As described above, the carbon nanotube 12 has a first end 14 and a second end 16. Accordingly, a center section 30 is disposed between the first end 14 of the carbon nanotube 12 and the second end 16 of the carbon nanotube 12. In one embodiment of the present invention, a portion of the semiconductor material 28 is disposed adjacent to and at a distance from the center section 30 of the carbon nanotube 12, with the dielectric material 22, a portion of the first metal electrode 24 and a portion of the second metal electrode 26 disposed between the semiconductor material 28 and the center section 30 of the carbon nanotube 12. In an alternative embodiment of the present invention, a portion of the semiconductor material 28 is disposed adjacent to and at a distance from the center section 30 of the carbon nanotube 12, with only the dielectric material 22 disposed between the semiconductor material 28 and the center section 30 of the carbon nanotube 12. Again, this difference relates to the spacing between the first metal electrode 24 and the second metal electrode 26 and its significance is described in detail below.

Figure 2:
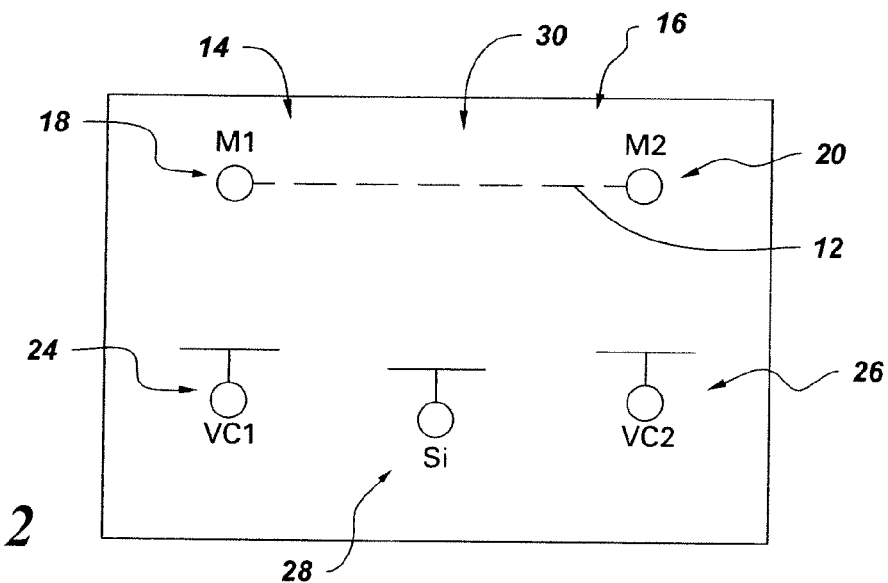
FIG. 2 is a circuit diagram representing the electrostatically-doped carbon nanotube device of FIG. 1.

Referring to FIG. 2, the structure for forming an electrostatically-doped carbon nanotube device 10 (FIG. 1) is represented by a circuit diagram. The first metal contact ("M1") 18 is electrically coupled to the first end 14 of the carbon nanotube 12 and the second metal contact ("M2") 20 is electrically coupled to the second end 16 of the carbon nanotube 12. Similarly, the first metal electrode ("VC1") 24 is capacitively coupled to the first end 14 of the carbon nanotube 12 and the second metal electrode ("VC2") 26 is capacitively coupled to the second end 16 of the carbon nanotube 12. In this respect, VC1 24 and VC2 26 form a first gate and a second gate, respectively. In the alternative embodiment of the present invention described above, with only the dielectric material 22 (FIG. 1) disposed between the semiconductor material 28 and the center section 30 of the carbon nanotube 12, the semiconductor material ("SI") 28 is capacitively coupled to the center section 30 of the carbon nanotube 12 and forms a third gate, which otherwise does not exist.

In operation, a first bias is applied to VC1 24, resulting in the electrostatic doping of the first end 14 of the carbon nanotube 12. Likewise, a second bias is applied to VC2 26, resulting in the electrostatic doping of the second end 16 of the carbon nanotube 12. Depending upon the bias applied, the first end 14 of the carbon nanotube 12 and the second end 16 of the carbon nanotube 12 may each be made a p-type semiconductor (hole majority carrier) or an n-type semiconductor (electron majority carrier). If the first end 14 of the carbon nanotube 12 is made a p-type semiconductor and the second end 16 of the carbon nanotube 12 is made an n-type semiconductor, or vice versa, the result is a P-N junction. A P-N junction may be used to form a light-emitting diode ("LED"), as is well known to those of ordinary skill in the art. The preferred voltage range of the structure for forming an electrostatically-doped carbon nanotube device 10 is between about +/−1 V and about +/−30 V for VC1 24 and VC2 26.

In the alternative embodiment of the invention described above, with only the dielectric material 22 disposed between SI 28 and the center section 30 of the carbon nanotube 12, SI 28 is used to modulate the doping of the center section 30 of the carbon nanotube 12. Thus, the center section 30 of the carbon nanotube 12 may be made a p-type semiconductor, an I-type (intrinsic) semiconductor or an n-type semiconductor. This results in a number of possible configurations, summarized in Table 1 below, and a number of possible devices, well known to those of ordinary skill in the art.

TABLE 1

Electrostatically-Doped Carbon Nanotube Junctions and Devices

| Bias Modes | | | | |
|---|---|---|---|---|
| VC1 | SI | VC2 | Junction | Device(s) |
| Low | — | Low | P-I-P | Back-to-Back Junctions |
| Low | — | High | P-I-N | Light-Emitting Diode ("LED") |
| High | — | Low | N-I-P | Light-Emitting Diode ("LED") |
| High | — | High | N-I-N | Back-to-Back Junctions |
| Low | High | Low | P-N-P | Bipolar Junctions |
| High | Low | High | N-P-N | Bipolar Junctions |

Figure 3:
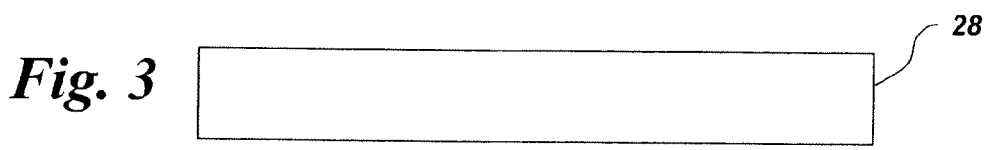
FIGS. 3-7 are cross-sectional views illustrating a method for forming an electrostatically-doped carbon nanotube device in accordance with an embodiment of the invention.
Figure 4:
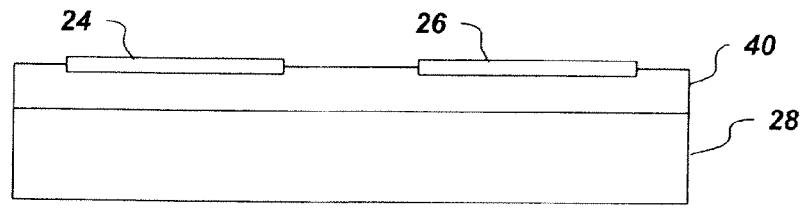

Referring to FIGS. 3 and 4, in another embodiment of the invention, a method for forming an electrostatically-doped carbon nanotube device includes first providing the semiconductor layer 28 described above. Again, the semiconductor layer 28 includes Si, SiC or the like. Alternatively, a metal layer 28 may be provided, such as Al, Cr, Mo, Ti, Pt or the like. Preferably, the semiconductor layer 28 has a thickness of between about 1 micron and about 550 microns. A first insulating layer 40 is deposited or grown on the surface of the semiconductor layer 28 using a thermal oxide, a chemical vapor deposition dielectric, a plasma-enhanced chemical vapor deposition dielectric, a low-pressure chemical vapor deposition dielectric or the like. The first insulating layer 40 includes $SiO_2$, $Si_3N_4$, $Al_2O_3$, $ZrO_2$ or the like. Preferably, the first insulating layer 40 has a thickness of between about 2 nm and about 100 nm. Following the deposition or growth of the first insulating layer 40, a metal electrode material is patterned and deposited on the surface of the first insulating layer 40 to form the first metal electrode 24 and the second metal electrode 26 described above. The metal electrode material includes Mo, Ti, Pt, Au, Cr or the like. Preferably, the first metal electrode 24 and the second metal electrode 26 each have a thickness of between about 10 nm and about 100 nm.

Figure 5:
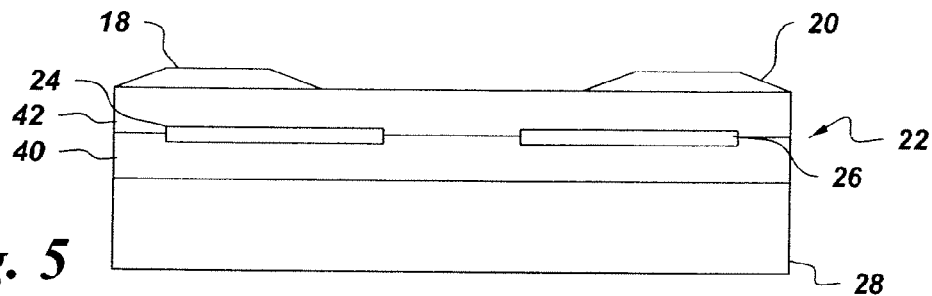

Referring to FIG. 5, a second insulating layer 42 is then deposited or grown on the surface of the first insulating layer 40, substantially surrounding the first metal electrode 24 and the second metal electrode 26, using a chemical vapor deposition dielectric, a plasma-enhanced chemical vapor deposition dielectric, a low-pressure chemical vapor deposition dielectric or the like. The second insulating layer 42 includes $SiO_2$, $Si_3N_4$, $Al_2O_3$, $ZrO_2$ or the like. Preferably, the second insulating layer 42 has a thickness of between about 2 nm and about 100 nm. Collectively, the first insulating layer 40 and the second insulating layer 42 form the dielectric layer 22 described above. Following the deposition or growth of the second insulating layer 42, a metal contact material is patterned and deposited on the surface of the second insulating layer 42 to form the first metal contact 18 and the second metal contact 20 described above. The metal contact material includes Ti, Mo, Au, Cr or the like. Preferably, the first metal contact 18 and the second metal contact 20 each have a thickness of between about 10 nm and about 100 nm.

Figure 6:
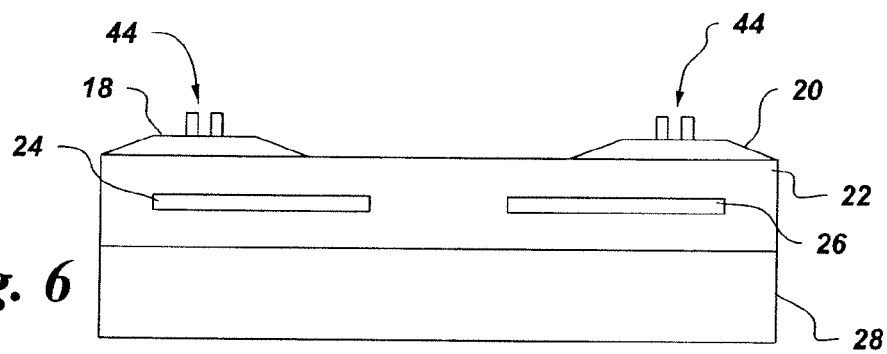
Figure 7:
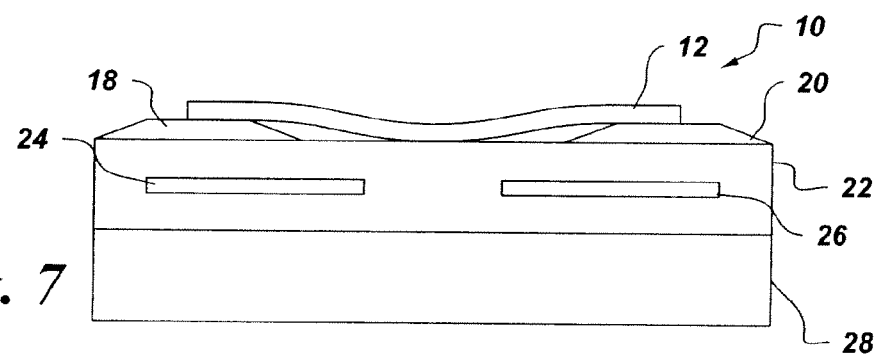

Referring to FIG. 6, a catalyst material 44 suitable for growing a carbon nanotube is then patterned and deposited on the surfaces of the first metal contact 18 and the second metal contact 20 using, for example, a lift-off technique, well known to those of ordinary skill in the art. The catalyst material 44 may take the form of a thin film or a nanoparticle and includes Ni, Fe, Co, Mo, $Al_2O_3$ in Fe nitrate or the like. Preferably, the catalyst material 44 has a thickness of between about 0.1 nm and about 1 nm. Prior to depositing the catalyst material 44 on the surfaces of the first metal contact 18 and the second metal contact 20, the surfaces of the first metal contact 18 and the second metal contact 20, as well as the dielectric layer 22, may be selectively coated with photo-resist. This photo-resist forms the appropriate pattern for the deposition of the catalyst material 44 and is subsequently removed. It should be noted that the catalyst material may be selectively deposited on the surface of only one of the first metal contact 18 and the second metal contact 20. Following the deposition of the catalyst material 44, the carbon nanotube 12 described above is grown, as illustrated in FIG. 7. Preferably, the carbon nanotube 12 is aligned substantially parallel to the surface of the dielectric layer 22. In general, the carbon nanotube 12 is grown in a chemical vapor deposition (CVD) tube coupled to a flowing carbon (hydrocarbon) source, such as a methane source or an acetylene source, at between about 700 degrees C. and about 1000 degrees C. The catalyst material 44 forms a plurality of "islands" at these temperatures and becomes supersaturated with carbon. Eventually, the carbon nanotube 12 grows from these catalyst islands. This process is well known to those of ordinary skill in the art.

Figure 8:
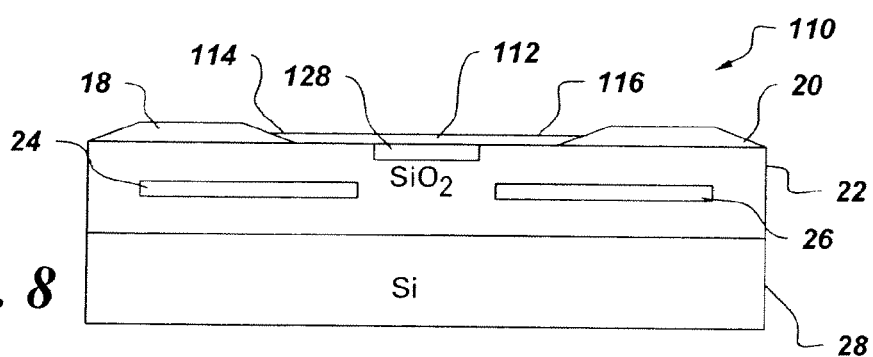
FIG. 8 is a cross-sectional view of a free-standing electrostatically-doped carbon nanotube device constructed in accordance with an embodiment of the invention.

Referring to FIG. 8, a free-standing electrostatically-doped carbon nanotube device 110 having a carbon nanotube 112 is shown. The free-standing electrostatically-doped carbon nanotube device 110 may be useful in photovoltaic devices, sensors, and/or power devices. When the carbon nanotube 112 is suspended as shown, the resulting diode exhibits a more ideal behavior, and such a configuration is better suited for electronic devices in general and more specifically for photovolataics. The carbon nanotube 112 has a first end 114 and a second end 116. The carbon nanotube 112 extends between and contacts a first metal contact 18, through the first end 114, and a second metal contact 20, through the second end 116. The carbon nanotube 112 may be either a single-walled carbon nanotube ("SWCNT") or a multi-walled carbon nanotube ("MWCNT"). The carbon nanotube 112 is similar in physical appearance, configuration, and size to the carbon nanotube 12 (FIG. 1). The first metal contact 18 and the second metal contact 20 may comprise Ti, Mo, Au, Cr, or the like, and each may comprise an area or size of between about 0.1 microns by about 10 microns and about 1 micron by about 10 microns. In general, however, it should be appreciated that any dimensions providing adequate electrical contact with the ends of the carbon nanotube 112 may be used. The first metal contact 18 and the second metal contact 20 may be disposed either above or below the ends 114, 116 of the carbon nanotube 112.

The first metal contact 18 and the second metal contact 20 are disposed on the surface of a substrate 22, such as, for example, a dielectric material. The dielectric material 22 may be formed of $SiO_2$, $Si_3N_4$, $Al_2O_3$, $ZrO_2$, or the like. A first metal electrode 24 and a second metal electrode 26 are disposed within the dielectric material 22, adjacent to and at a distance from the first metal contact 18 and the second metal contact 20, respectively. Because of this separation, the first metal electrode 24 is capacitively coupled to the first end 114 of the carbon nanotube 112 and the second metal electrode 26 is capacitively coupled to the second end 116 of the carbon nanotube 112. In certain embodiments, the distance between the first metal electrode 24 and the first end 114 of the carbon nanotube 112 and the second metal electrode 26 and the second end 116 of the carbon nanotube 112 is between about 2 nm and about 100 nm, respectively. The first metal electrode 24 and the second metal electrode 26 are each made of Mo, Ti, Pt, Au, Cr or the like, and each has an area or size of between about 0.1 microns by about 10 microns and about 1 micron by about 10 microns. Advantageously, the area or size of the first metal electrode 24 and the second metal electrode 26 may be selected to achieve a desired spacing between the first metal electrode 24 and the second metal electrode 26. The significance of this spacing has been described in detail.

The dielectric material 22 is disposed on the surface of a base material 28. The base material 28 may be a semiconductor material formed of Si, SiC, or the like. Alternatively, the base material 28 may be a metal layer 28, such as a layer comprising Al, Cr, Mo, Ti, Pt, or the like. A trench 128 is formed in the dielectric material 22, thus allowing the carbon nanotube 112 to be free-standing in that location. Enabling the carbon nanotube 112 to be free-standing from the dielectric material 22 allows for enhanced light emission when the carbon nanotube 112 is biased as a P-N junction diode.

Figure 9:
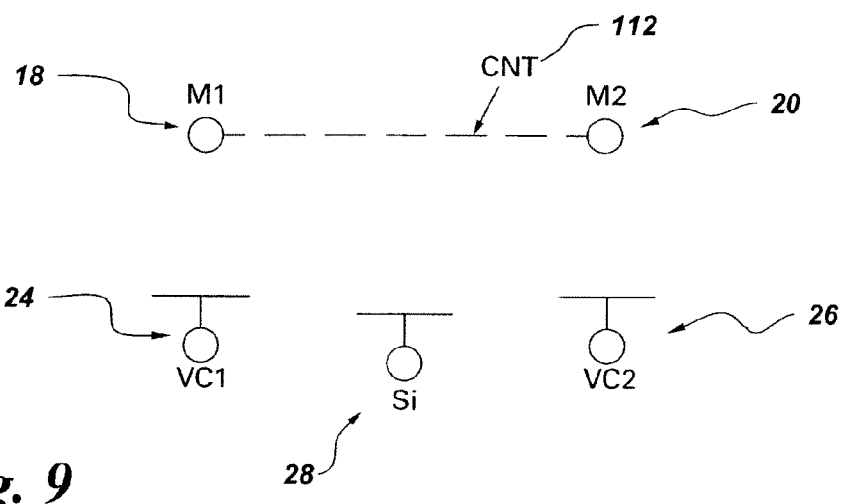
FIG. 9 is a circuit diagram representing the free-standing electrostatically-doped carbon nanotube device of FIG. 8.

With specific reference to FIG. 9, the free-standing electrostatically-doped carbon nanotube device 110 is represented by a circuit diagram. The first metal contact ("M1") 18 is electrically coupled to the first end 114 of the carbon nanotube 112 and the second metal contact ("M2") 20 is electrically coupled to the second end 116 of the carbon nanotube 112. Similarly, the first metal electrode ("VC1") 24 is capacitively coupled to the first end 114 of the carbon nanotube 112 and the second metal electrode ("VC2") 26 is capacitively coupled to the second end 116 of the carbon nanotube 112. In this respect, VC1 24 and VC2 26 form a first gate and a second gate, respectively.

In operation, a first bias is applied to VC1 24, resulting in the electrostatic doping of the first end 114 of the carbon nanotube 112. Likewise, a second bias is applied to VC2 26, resulting in the electrostatic doping of the second end 116 of the carbon nanotube 112. Depending upon the bias applied, the first end 114 of the carbon nanotube 112 and the second end 116 of the carbon nanotube 112 may each be made a p-type semiconductor (hole majority carrier) or an n-type semiconductor (electron majority carrier). If the first end 114 of the carbon nanotube 112 is made a p-type semiconductor and the second end 116 of the carbon nanotube 112 is made an n-type semiconductor, or vice versa, the result is a P-N junction. A P-N junction may be used to form a light-emitting diode ("LED"), a photovoltaic diode, a power device, a photo diode, a photo detector, or the like. The preferred voltage range of the structure for forming an electrostatically-doped carbon nanotube device 10 is between about +/−1 V and about +/−30 V for VC1 24 and VC2 26.

Figure 10:
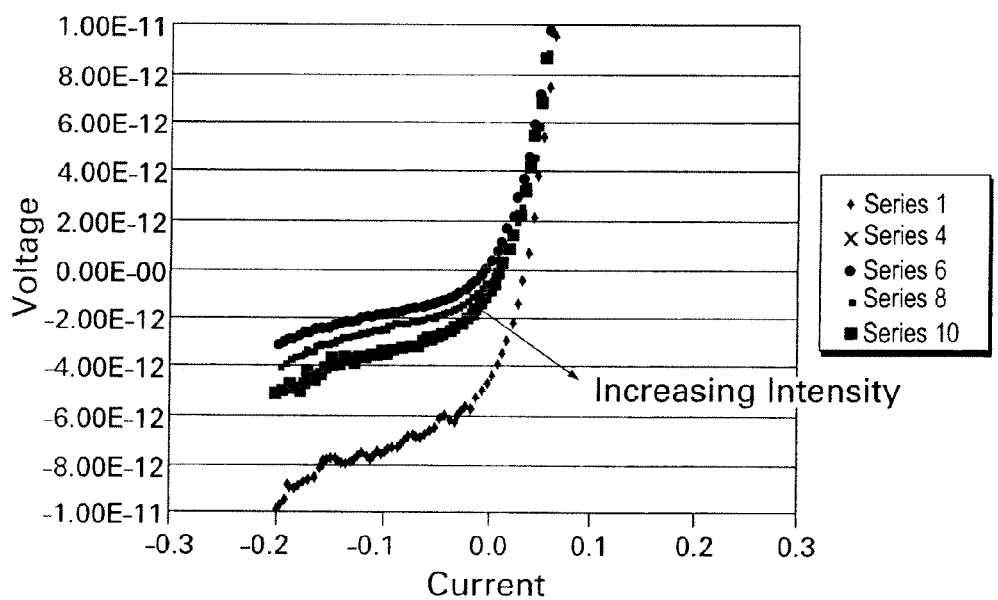
FIG. 10 is a graph illustrating photovoltaic results from the free-standing electrostatically-doped carbon nanotube device of FIG. 8.
Figure 11:
FIGS. 11-16 are cross-sectional views illustrating a method for forming a free-standing electrostatically-doped carbon nanotube device in accordance with an embodiment of the invention.
Figure 12:
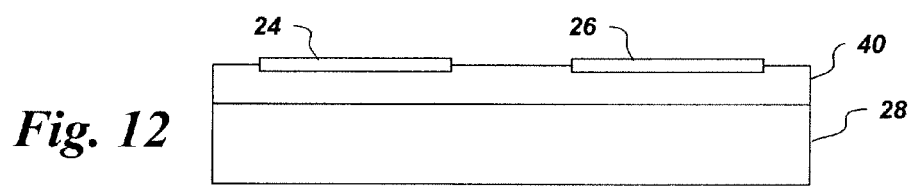

Single-walled carbon nanotubes are direct bandgap semiconductors and thus one or more of the free-standing electrostatically-doped carbon nanotube devices 110 may be utilized in a photovoltaic device, sensor, and/or a power device. FIG. 10 illustrates the photovoltaic responses of a single free-standing electrostatically-doped carbon nanotube device 110. The graph shows a shift in the current voltage characteristics of the free-standing electrostatically-doped carbon nanotube device 110 under progressively higher illumination intensity. The progressive shift to the fourth quadrant means greater power is being generated by the diode.

Referring now to FIGS. 11-16, there is shown process steps for forming a free-standing electrostatically-doped carbon nanotube device 110. As an initial step (FIGS. 11 and 12), an insulating layer 40 is deposited or grown on the surface of the semiconductor layer 28. The first insulating layer 40 may be formed using a thermal oxide, a chemical vapor deposition dielectric, a plasma-enhanced chemical vapor deposition dielectric, a low-pressure chemical vapor deposition dielectric, or the like. The first insulating layer 40 may comprise $SiO_2$, $Si_3N_4$, $Al_2O_3$, $ZrO_2$, or the like. Preferably, the first insulating layer 40 has a thickness of between about 2 nm and about 1000 nm. Following the deposition or growth of the first insulating layer 40, a metal electrode material is patterned and deposited on the surface of the first insulating layer 40 to form the first metal electrode 24 and the second metal electrode 26 described above. The metal electrode material may be formed of Mo, Ti, Pt, Au, Cr, or the like. Preferably, the first metal electrode 24 and the second metal electrode 26 each have a thickness of between about 10 nm and about 100 nm.

Figure 13:
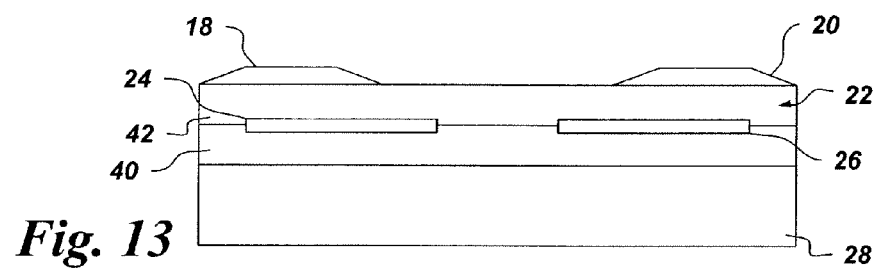

Referring to FIG. 13, a second insulating layer 42 is then deposited or grown on the surface of the first insulating layer 40, substantially surrounding the first metal electrode 24 and the second metal electrode 26. The second insulating layer 42 may be formed using a chemical vapor deposition dielectric, a plasma-enhanced chemical vapor deposition dielectric, a low-pressure chemical vapor deposition dielectric or the like. The second insulating layer 42 includes $SiO_2$, $Si_3N_4$, $Al_2O_3$, $ZrO_2$ or the like. Preferably, the second insulating layer 42 has a thickness of between about 2 nm and about 100 nm. Collectively, the first insulating layer 40 and the second insulating layer 42 form the dielectric layer 22 described above. Following the deposition or growth of the second insulating layer 42, a metal contact material is patterned and deposited on the surface of the second insulating layer 42 to form the first metal contact 18 and the second metal contact 20 described above (FIG. 15). The metal contact material may comprise Ti, Mo, Au, Cr or the like. Preferably, the first metal contact 18 and the second metal contact 20 each have a thickness of between about 10 nm and about 100 nm.

Figure 14:
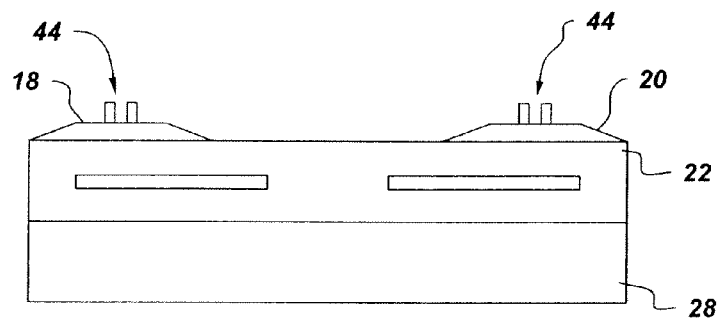
Figure 15:
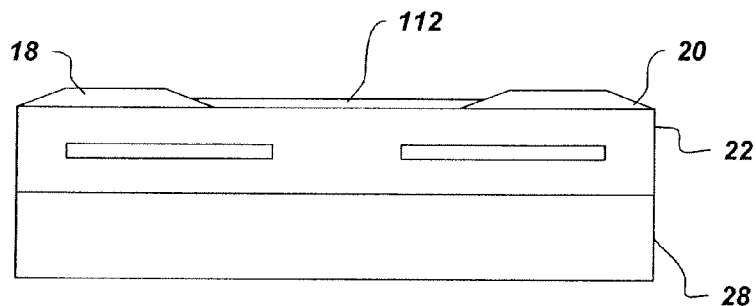

Referring to FIG. 14, a catalyst material 44 suitable for growing a carbon nanotube is then patterned and deposited on the surfaces of the first metal contact 18 and the second metal contact 20 using, for example, a lift-off technique, which is well known to those of ordinary skill in the art. The catalyst material 44 may take the form of a thin film or a nanoparticle and may include elements such as Ni, Fe, Co, or Mo, or mixtures such as $Al_2O_3$ in Fe nitrate, or the like. In some embodiments, the catalyst material 44 has a thickness of between about 0.1 nm and about 1 nm. Prior to depositing the catalyst material 44 on the surfaces of the first metal contact 18 and the second metal contact 20, the surfaces of the first metal contact 18 and the second metal contact 20, as well as the dielectric layer 22, may be selectively coated with photo-resist. The photo-resist serves to form the appropriate pattern for the deposition of the catalyst material 44 and is subsequently removed. It should be noted that the catalyst material 44 may be selectively deposited on the surface of only one of the first metal contact 18 and the second metal contact 20.

Figure 16:
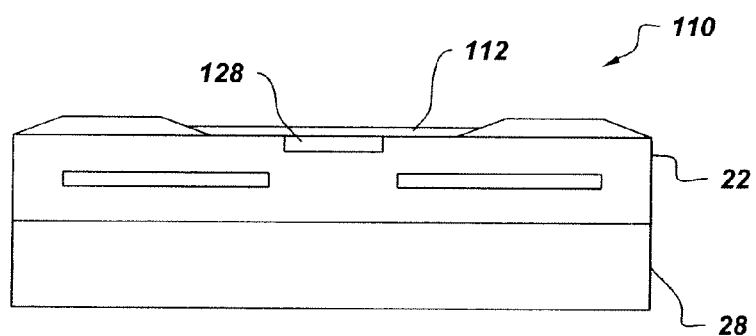
Figure 17:
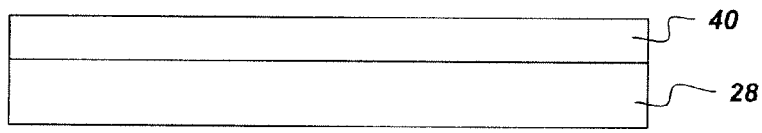
FIGS. 17-21 are cross-sectional views illustrating a method for forming a free-standing electrostatically-doped carbon nanotube device in accordance with an embodiment of the invention.

Following the deposition of the catalyst material 44, the carbon nanotube 112 described above is grown, as illustrated in FIG. 15. Preferably, the carbon nanotube 112 is aligned substantially parallel to the surface of the dielectric layer 22. In general, the carbon nanotube 112 is grown in a chemical vapor deposition (CVD) tube coupled to a flowing carbon (hydrocarbon) source, such as a methane source or an acetylene source, at between about 700 degrees C. and about 1000 degrees C. The catalyst material 44 forms a plurality of "islands" at these temperatures and becomes supersaturated with carbon. Eventually, the carbon nanotube 112 grows from these catalyst islands. This process is well known to those of ordinary skill in the art. Finally, as shown in FIG. 16, a trench 128 is etched in the dielectric layer 22 to enable the carbon nanotube 112 to be free-standing.

Referring now to FIGS. 17-21, there is shown an alternative method for forming a free-standing electrostatically-doped carbon nanotube device 110. As an initial step (FIG. 17), an insulating layer 40 is deposited or grown on the surface of the semiconductor layer 28. The first insulating layer 40 may be formed using a thermal oxide, a chemical vapor deposition dielectric, a plasma-enhanced chemical vapor deposition dielectric, a low-pressure chemical vapor deposition dielectric, or the like. Following the deposition or growth of the first insulating layer 40, a metal electrode material is patterned and deposited on the surface of the first insulating layer 40 to form the first metal electrode 24 and the second metal electrode 26 described above.

Figure 18:
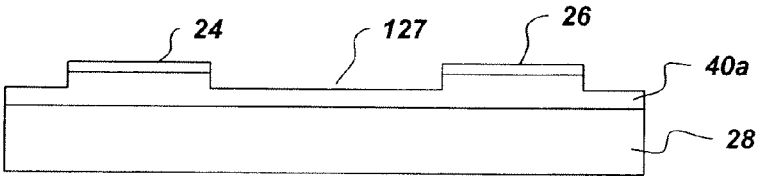
Figure 19:
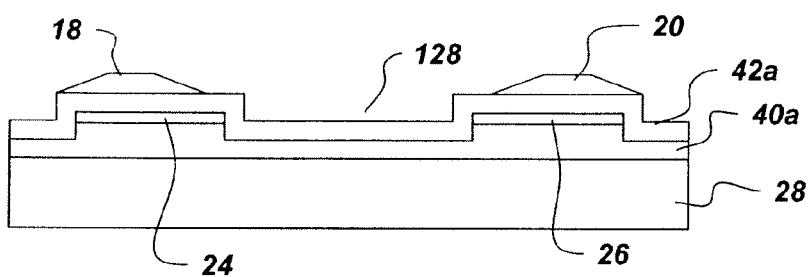
Figure 21:
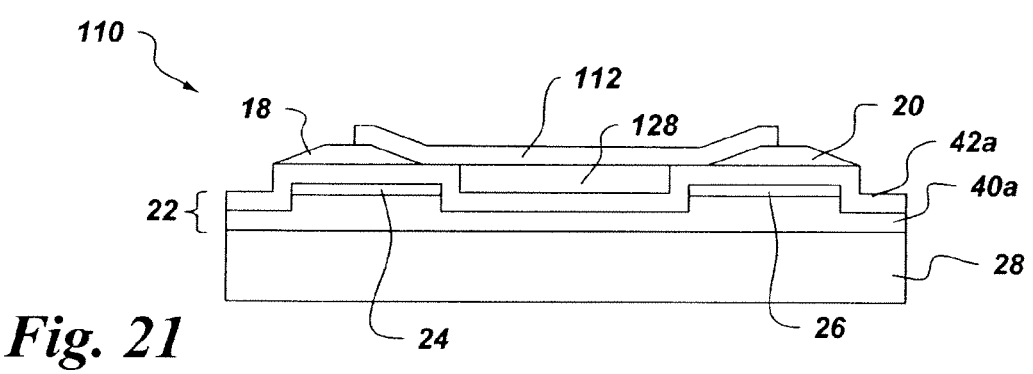

Referring to FIG. 18, a portion of the first insulating layer 40 is removed to form an altered first insulating layer 40a. Suitable removal processes include etching and lithographic techniques. The first and second metal electrodes 24, 26 may be used as masks during an etching or lithography process. Suitable etchant material for etching the first insulating layer 40a includes wet etchants such as buffered oxide etch for $SiO_2$ or plasma dry etchants. An open area 127 is formed between the first and second metal electrodes 24, 26 through the etching process. With reference to FIG. 21, a second insulating layer 42a is then deposited or grown on the surface of the etched first insulating layer 40a, substantially surrounding the first metal electrode 24 and the second metal electrode 26. The second insulating layer 42a conforms to the etched first insulating layer 40a. The conformance of the second insulating layer 42a at the open area 127 allows for the formation of a trench 128 between the first and second metal electrodes 24, 26. Following the deposition or growth of the second insulating layer 42a, a metal contact material is patterned and deposited on the surface of the second insulating layer 42 to form the first metal contact 18 and the second metal contact 20.

Figure 20:
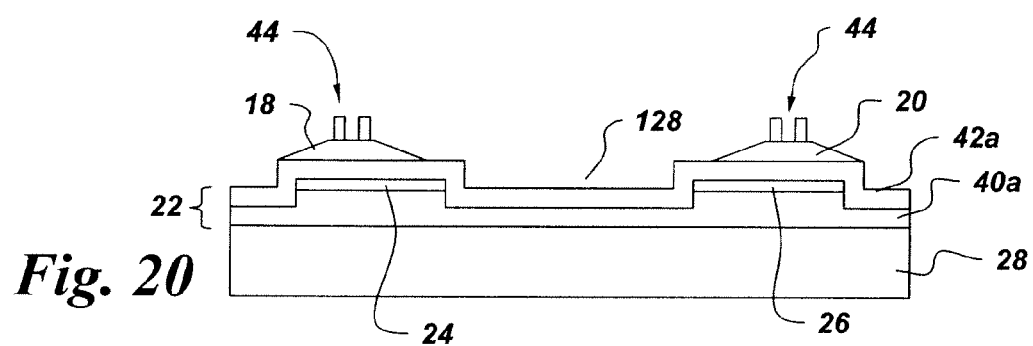

Referring to FIG. 20, a catalyst material 44 suitable for growing a carbon nanotube is then patterned and deposited on the surfaces of the first metal contact 18 and the second metal contact 20 using, for example, a lift-off technique, which is well known to those of ordinary skill in the art. Prior to depositing the catalyst material 44 on the surfaces of the first metal contact 18 and the second metal contact 20, the surfaces of the first metal contact 18 and the second metal contact 20, as well as the dielectric layer 22, may be selectively coated with photo-resist. The photo-resist serves to form the appropriate pattern for the deposition of the catalyst material 44 and is subsequently removed. It should be noted that the catalyst material 44 may be selectively deposited on the surface of only one of the first metal contact 18 and the second metal contact 20. Following the deposition of the catalyst material 44, the carbon nanotube 112 described above is grown, as illustrated in FIG. 21.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while embodiments of the invention have been described in terms of a single electrostatically-doped carbon nanotube, it should be appreciated that an array, or suite, of electrostatically-doped carbon nanotubes 12, 112 may be arranged to form numerous power devices. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A method for forming a free-standing electrostatically-doped carbon nanotube device, comprising:
   providing a carbon nanotube on a substrate, said carbon nanotube having a first end, a second end, and a free-standing portion therebetween;
   disposing a first metal contact on the substrate directly adjacent to and electrically coupled to the first end of the carbon nanotube;
   disposing a second metal contact on the substrate directly adjacent to and electrically coupled to the second end of the carbon nanotube;
   disposing a first metal electrode within the substrate adjacent to and at a distance from the first end of the carbon nanotube, wherein the first metal electrode is capacitively coupled to the first end of the carbon nanotube;
   disposing a second metal electrode within the substrate adjacent to and at a distance from the second end of the carbon nanotube, wherein the second metal electrode is capacitively coupled to the second end of the carbon nanotube;
   selectively applying a first bias to the first metal electrode to electrostatically dope the first end of the carbon nanotube; and
   selectively applying a second bias to the second metal electrode to electrostatically dope the second end of the carbon nanotube.

2. The method of claim 1, comprising forming a trench in the substrate to form the free-standing portion of the carbon nanotube.

3. The method of claim 1, wherein the carbon nanotube serves as a semiconductor material.

4. The method of claim 1, wherein the free-standing portion of the carbon nanotube is formed by:
   disposing the first and second metal electrodes on a first substrate portion;
   removing a portion of the first substrate portion between the first and second metal electrodes;
   conformally disposing a second substrate portion over the first substrate portion to form a trench in the second substrate portion.

5. The method of claim 1, wherein selectively applying the first bias to the first metal electrode to electrostatically dope the first end of the carbon nanotube comprises making the first end of the carbon nanotube one of a p-type semiconductor (hole majority carrier) and an n-type semiconductor (electron majority carrier).

6. The method of claim 1, wherein selectively applying the second bias to the second metal electrode to electrostatically dope the second end of the carbon nanotube comprises making the second end of the carbon nanotube one of a p-type semiconductor (hole majority carrier) and an n-type semiconductor (electron majority carrier).

* * * * *